United States Patent
Scherer et al.

(10) Patent No.: US 6,534,798 B1
(45) Date of Patent: Mar. 18, 2003

(54) SURFACE PLASMON ENHANCED LIGHT EMITTING DIODE AND METHOD OF OPERATION FOR THE SAME

(75) Inventors: Axel Scherer, Laguna Beach; Jelena Vuckovic; Marko Loncar, both of Pasadena, all of CA (US)

(73) Assignee: California Institute of Technology, Pasadena, CA (US)

( * ) Notice: Subject to any disclaimer, the term of this patent is extended or adjusted under 35 U.S.C. 154(b) by 45 days.

(21) Appl. No.: 09/656,323

(22) Filed: Sep. 6, 2000

Related U.S. Application Data

(60) Provisional application No. 60/153,125, filed on Sep. 8, 1999.

(51) Int. Cl.$^7$ ............................................. H01L 33/00
(52) U.S. Cl. .......................... 257/98; 257/99; 372/99; 372/102
(58) Field of Search ........................... 257/95, 98, 99, 257/103; 372/49, 50, 99, 102

(56) References Cited

U.S. PATENT DOCUMENTS 6,034,809 A * 3/2000 Anemogiannis ............ 359/254

2001/0040679 A1 * 11/2001 Kawabata et al. .......... 356/445

FOREIGN PATENT DOCUMENTS

| EP | 1 054 290 | * 11/2000 |
| JP | 2000-138420 | * 5/2000 |

* cited by examiner

*Primary Examiner*—Minh Loan Tran
(74) *Attorney, Agent, or Firm*—Daniel L. Dawes; Myers, Dawes & Andras LLP

(57) ABSTRACT

The emission properties of light-emitting diodes are enhanced by coupling to surface plasmons. The semiconductor emitter layer of the light-emitting diode is thinner than $\lambda/2$ and is sandwiched between two metal films. A periodic pattern is defined in the top semitransparent metal layer by lithography with the result that it efficiently couples out the light emitted from the semiconductor and simultaneously enhances the spontaneous emission rate. Extraction efficiencies of up to 35% and Purcell factors of up to 4.5 are obtainable. Photoluminescence intensities of up to 46 times higher in fabricated structures compared to unprocessed wafers are obtained. The increased light emission is due to an increase in the efficiency and an increase in the pumping intensity resulting from trapping of pump photons within the microcavity.

20 Claims, 13 Drawing Sheets

FIG. 4
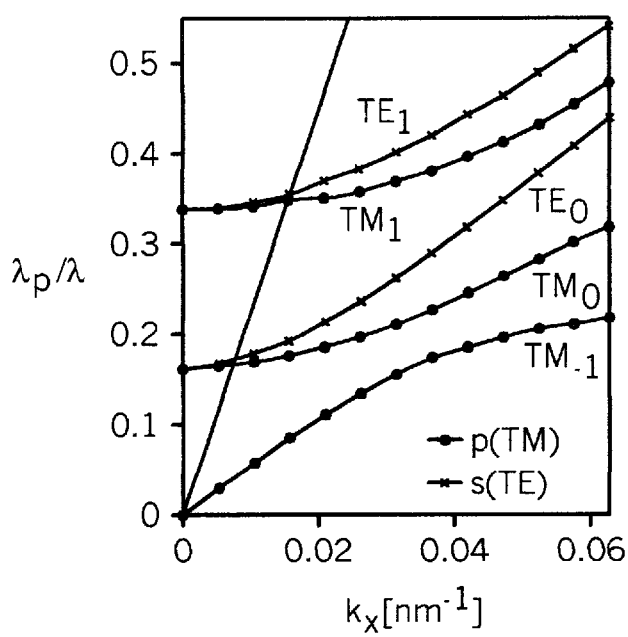
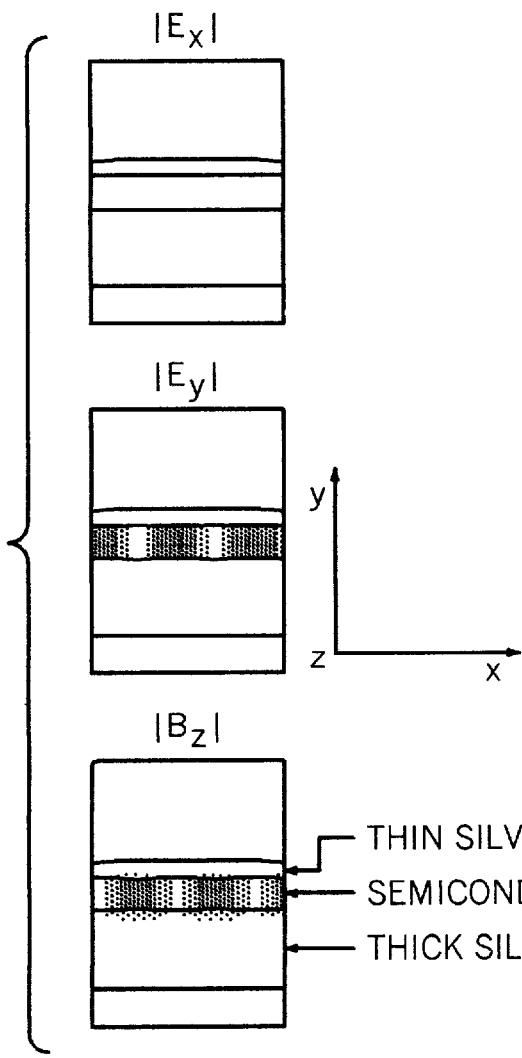
FIG. 5

SURFACE PLASMON ENHANCED LIGHT EMITTING DIODE AND METHOD OF OPERATION FOR THE SAME

RELATED APPLICATIONS

The present application relates back to U.S. Provisional Patent Application No. 60/153,125 filed on Sep. 8, 1999.

The present application was funded at least in part by the U.S. Government from funds from F49620-981-0447 and may be subject to government rights.

BACKGROUND OF THE INVENTION

1. Field of the Invention

The invention relates to the field of light emitting diodes and in particular to a structure and method of increasing the light output.

2. Description of the Prior Art

For years, a significant amount of scientific work has been focused on ways of improving the extraction efficiency of light emitting diodes. Many interesting approaches have been proposed to accomplish this, such as the use of thin light emitting layers with periodic surface texturing, resonant cavities, photon recycling or output coupling through surface plasmons excited at corrugated metal surfaces. External quantum efficiencies of 31% were reported by employing reflection from a bottom metal mirror together with a textured top semiconductor surface.

Apart from efforts to extract as much light as possible from a semiconductor device, it is also possible to enhance the light emission rate within a semiconductor. This approach is based on Purcell's prediction in 1946 that the radiation rate of an atom placed within a wavelength-sized cavity can be changed. A 5-fold enhancement of spontaneous emission was recently measured in a semiconductor optical microcavity at low temperatures and it has been demonstrated that Purcell factors of about 55 can be achieved when a InGaN/GaN quantum well (QW) is positioned close to a thin silver layer.

In order to build an ideal, highly efficient light-emitting diode (LED), it is desirable to improve the extraction efficiency and simultaneously enhance the spontaneous emission rate. A 15-fold emission intensity enhancement, with Purcell factor Fp=2 was observed in two dimensional periodic thin film photonic crystals. On the other hand, it has been recently discussed that a potentially highly efficient LED consisting of a metal clad dielectric microcavity with periodic texturing of one of metal layers might be possible. This, however, was not actually proved and was only a theoretical conjecture.

What is needed is some kind of a method and structure for enhancing the light emission from LEDs.

BRIEF SUMMARY OF THE INVENTION

The invention is defined as an improvement in a light emitting diode comprising an active light emitting semiconductor layer having a first and second parallel surface, an optically reflecting layer disposed on the first surface of the semiconductor layer, and an optically reflecting grating disposed on the second surface of the active light emitting semiconductor layer. The grating has a pattern which is selected or arranged so that surface plasmon waves are coupled out through the grating. More specifically, in the illustrated embodiment the grating has a regular periodic structure, which is either a one or two dimensionally periodic structure. The optically reflecting grating is partially transparent. In the illustrated embodiment optically reflecting layer disposed on the first surface and the optically reflecting grating disposed on the second surface are conductive layers.

In the illustrated embodiment the active light emitting semiconductor layer comprises a semiconductor membrane, which includes a layer having or acting as a quantum well.

The invention can be characterized as improvement as described above where the grating has a selected pattern which is characterized by its coupling to surface plasmons generated by the light emitting semiconductor layer. The light emitting semiconductor layer in combination with the an optically reflecting layer and the an optically reflecting grating comprise a microcavity. The grating is then characterized by a pattern which couples out surface plasmons in the microcavity.

The invention can also be defined as an improved light emitting diode comprising an active light emitting semiconductor layer having a first and second parallel and opposing surface, an conductive layer disposed on the first surface of the semiconductor layer, and an conductive grating disposed on the second surface of the active light emitting semiconductor layer. The conductive layer and conductive grating with the semiconductor layer therebetween defines a cavity. The grating has a pattern which is selected so that surface plasmon waves within the cavity are coupled through the grating.

Still further the invention is defined as a method of improving emission from a light emitting diode comprising the steps of providing an active light emitting semiconductor layer having a first and second parallel surface. An optically reflecting layer is disposed on the first surface of the semiconductor layer. An optically reflecting grating with a selected pattern is defined therein. The grating is disposed on the second surface of the active light emitting semiconductor layer. The surface plasmon waves are coupled through the optically reflecting grating. The selected pattern is thus characterized being arranged and configured so that surface plasmon waves are coupled therethrough. While the method has been described here for grammatical ease as a combination of steps, it is to be explicitly understood that the method is not necessarily limited by the construction of 35 USC 112 to the disclosed methodology, but includes all acts which fall within the scope of the defining claims.

The invention can be better visualized by now turning to the following drawings where like elements are referenced by like numerals.

BRIEF DESCRIPTION OF THE DRAWINGS

FIG. 4 is a band diagram of the unpatterned (flat) metal clad microcavity. Silver layers are 40 nm and 200 nm thick and the semiconductor core thickness is 90 nm. Absorption losses in silver were not included.

FIG. 5 is a diagram of the intensities of electric and magnetic field components for the $TM_{-1}$ mode, with $$\frac{\lambda_p}{\lambda} = 0.084 \text{ and } k_x = 0.0157 \text{ nm}^{-1}.$$

The analyzed structure has the same parameters as the one whose band diagram is shown in FIG. 4.

Figure 6:
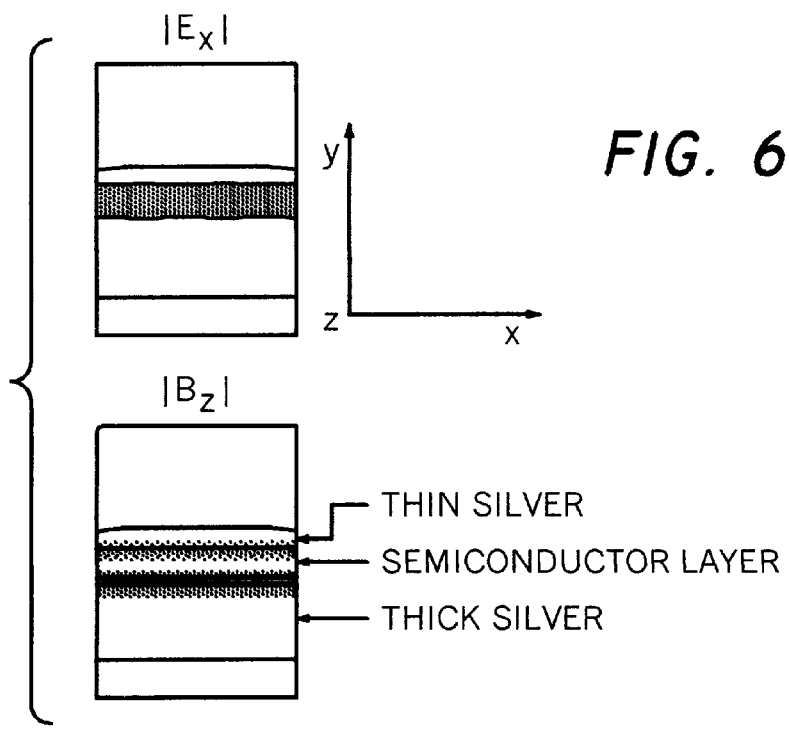

FIG. 6 is a diagram of the intensities of the x component of the electric field and the z component of the magnetic field for the TMo mode, with $$\frac{\lambda_p}{\lambda} = 0.16 \text{ and } k_x = 0.$$

for this mode. The analyzed structure has the same parameters as the one whose band diagram is shown in FIG. 4.

Figure 7:
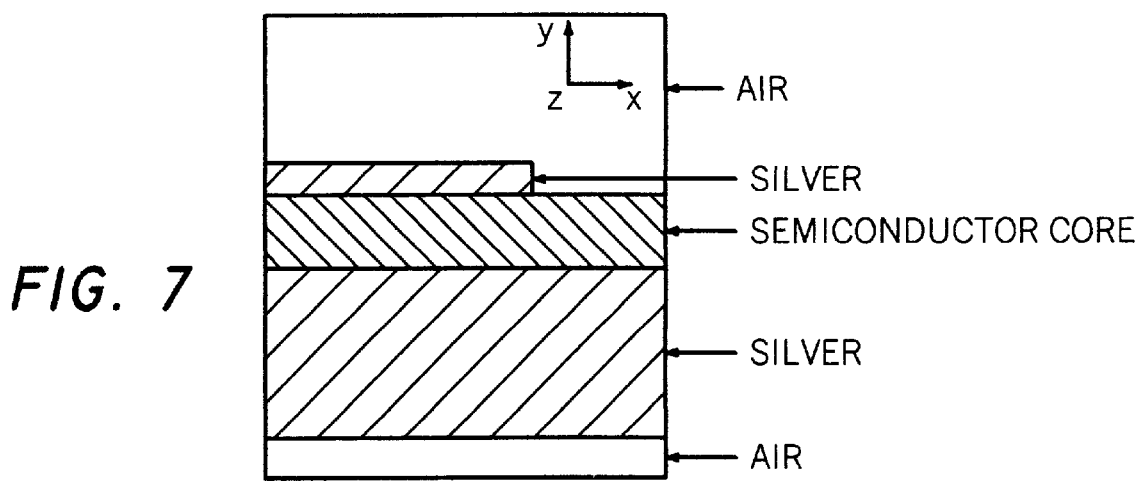

FIG. 7 is a diagram of a structure with a grating defined in the top semitransparent layer analyzed using the FDTD method in order to study the effect of metal patterning. Mur's absorbing boundary conditions are applied to boundaries in the y direction and Bloch boundary conditions are applied boundaries in the x direction. a denotes the grating periodicity.

Figure 8:
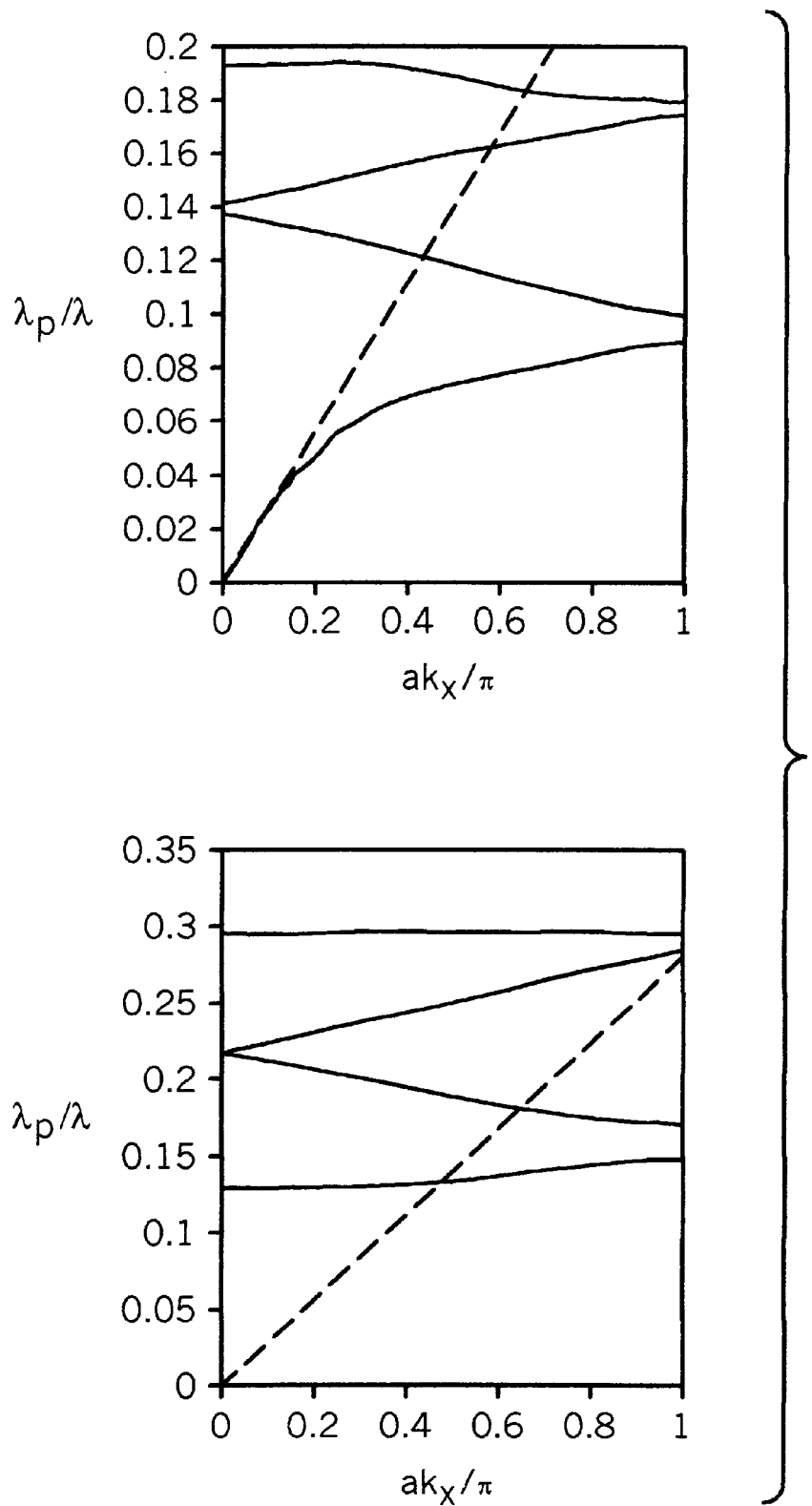

FIGS. 8 and b are band diagrams of the patterned structure with a periodicity of a=250 nm: (a) TM-polarization; (b)TE polarization. The dashed line corresponds to the light line in air.

Figure 9A:
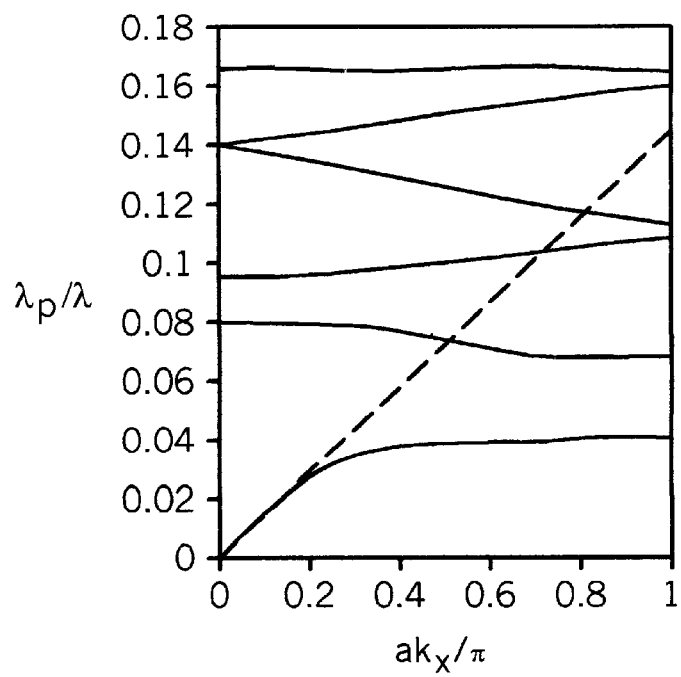

FIGS. 9a and b are band diagrams of the patterned structure with a periodicity of a=480 nm: (a) TM-polarization; (b)TE polarization. The dashed line corresponds to the light line in air.

Figure 10:
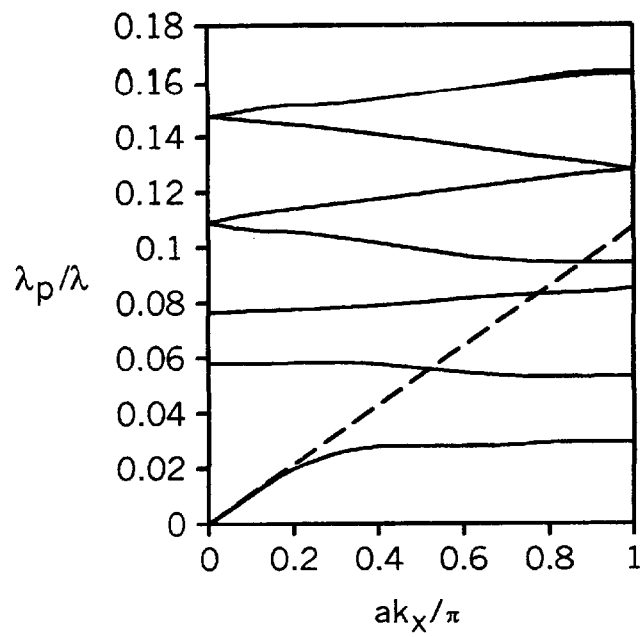

FIG. 10 is a band diagram of the structure with a grating periodicity of 650 nm (TM-polarization only). The dashed line corresponds to the light line in air.

Figure 11:
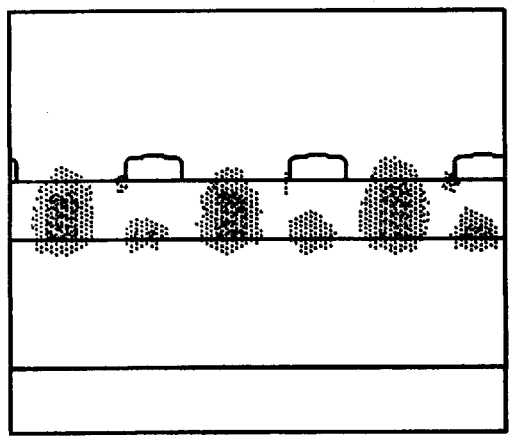
Figure 11:
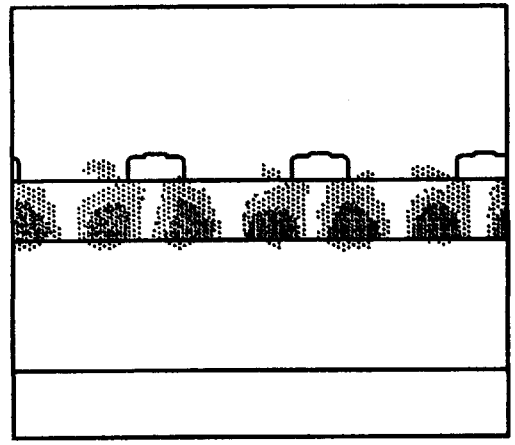

FIG. 11 is a diagram of the intensities of electric field components for the structure with a periodicity of 250 nm. The filtered frequency range was centered around $$\frac{\lambda_p}{\lambda} \approx 0.14 \text{ and } k_x = 0.$$

Figure 12:
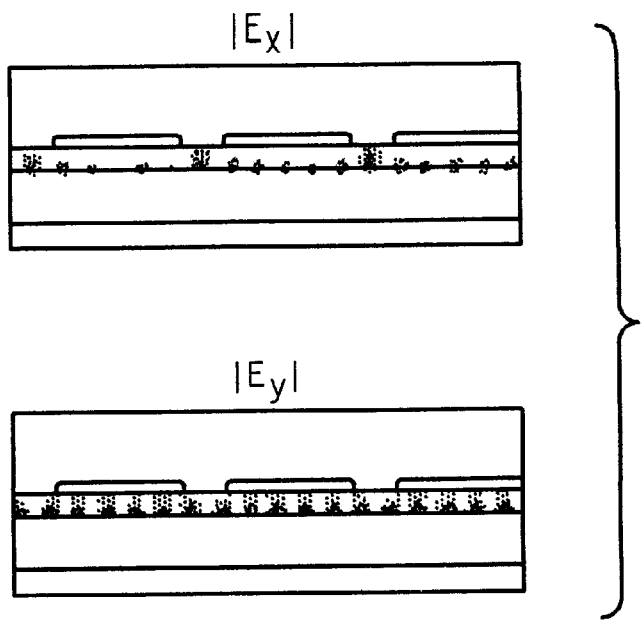

FIG. 12 is a diagram of the intensities of electric field components for the structure with a periodicity of 650 nm. The filtered frequency range was centered around $$\frac{\lambda_p}{\lambda} = 0.15 \text{ and } k_x = 0.$$

Figure 13:
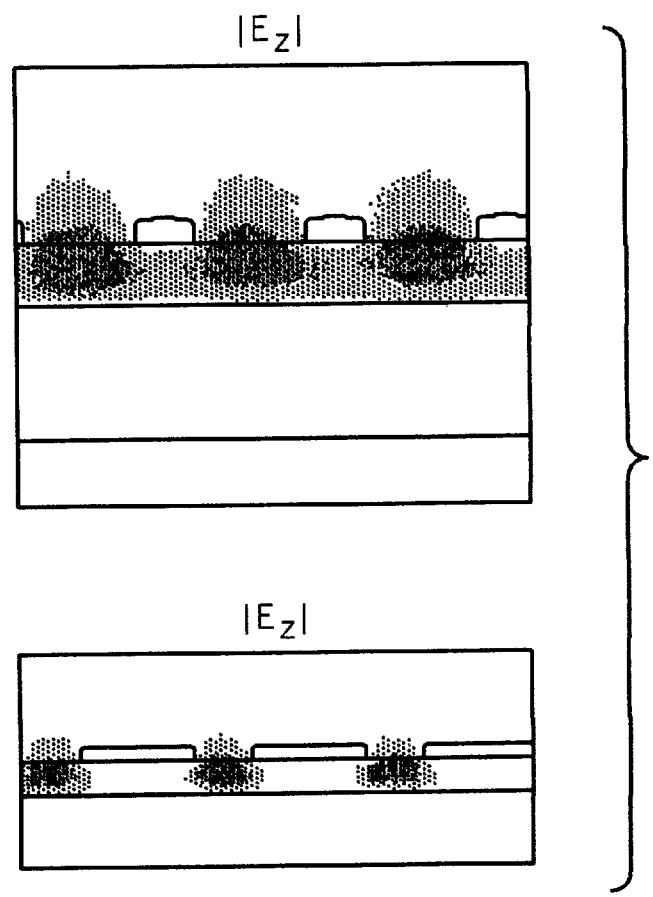

FIG. 13 is a diagram of the intensities of $E_z$ electric field components for the structure with periodicities of 250nm and 480nm top and bottom respectively. The filtered frequency range was centered around $\lambda_p/\lambda=0.14$ and $k_x=0$.

Figure 14:
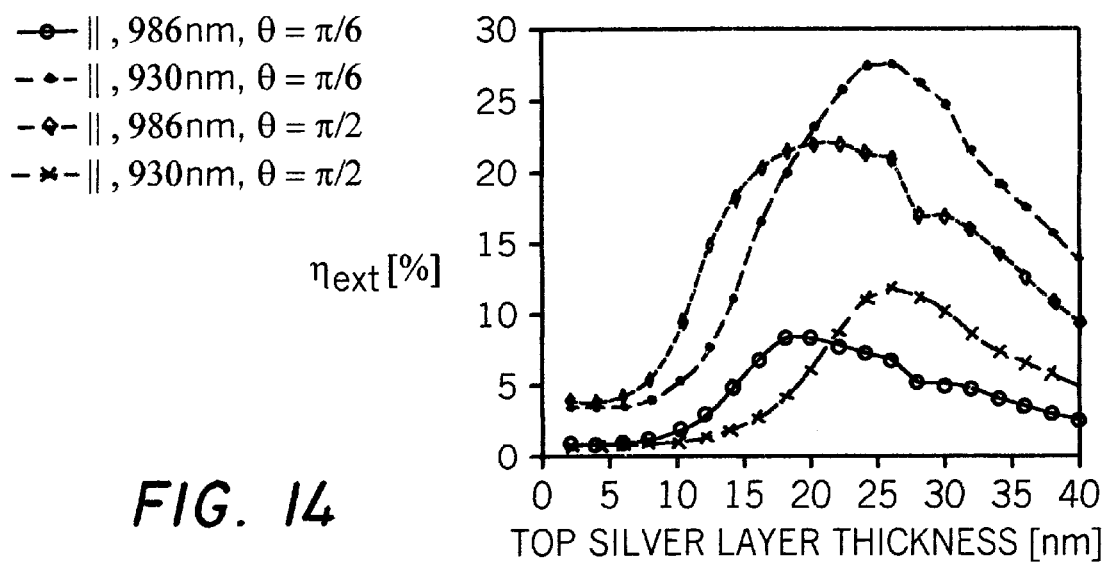

FIG. 14 is a graph of the calculated extraction efficiency for the unpatterned metal clad microcavity, as a function of the top, semitransparent silver layer thickness. We calculated lent into the 30° or 90° collection angle. The emitter is a parallel dipole positioned in the middle of the 90 nm thick membrane, oscillating at the wavelength of 986 nm or 930 nm.

Figure 15:
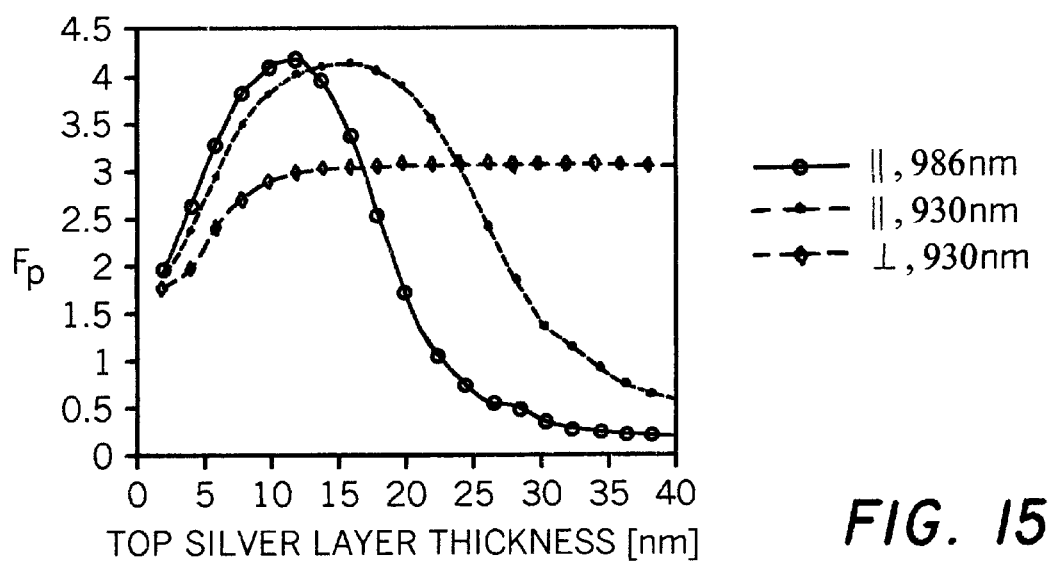

FIG. 15 is a graph of the calculated Purcell factor for the unpatterned metal cad microcavity, as a function of the top, semitransparent silver layer thickness. The emitter is a parallel or a perpendicular dipole positioned in the middle of the 90 nm thick membrane. oscillating at the wavelength of 986 nm or 930 nm.

Figure 16:
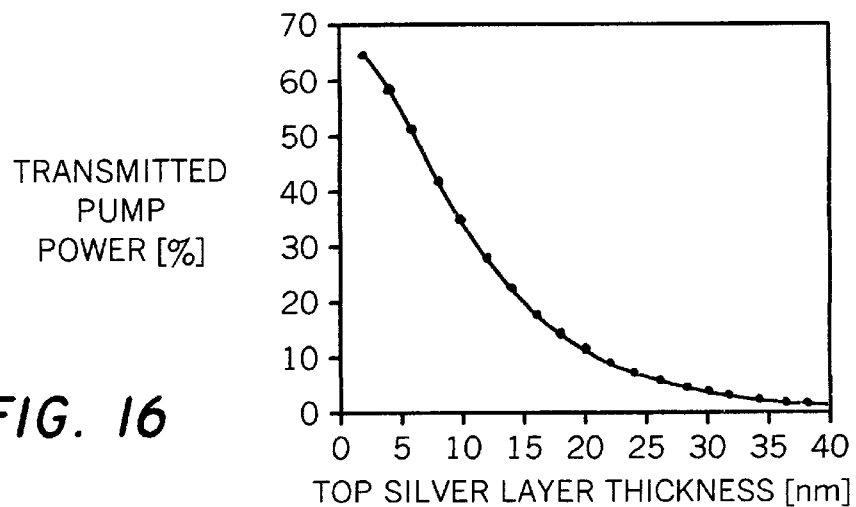

FIG. 16 is a graph of the percentage of the pump beam intensity transmitted through the top, unpatterned silver layer, as function of its thickness.

Figure 17:
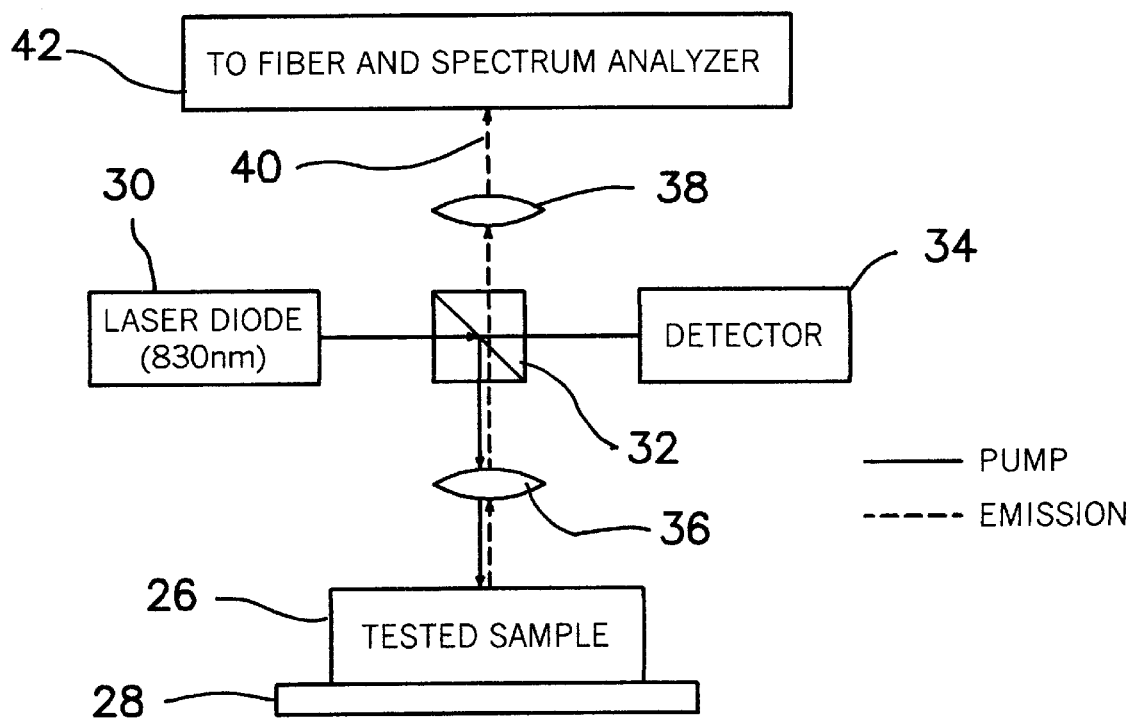
Figure 18A:
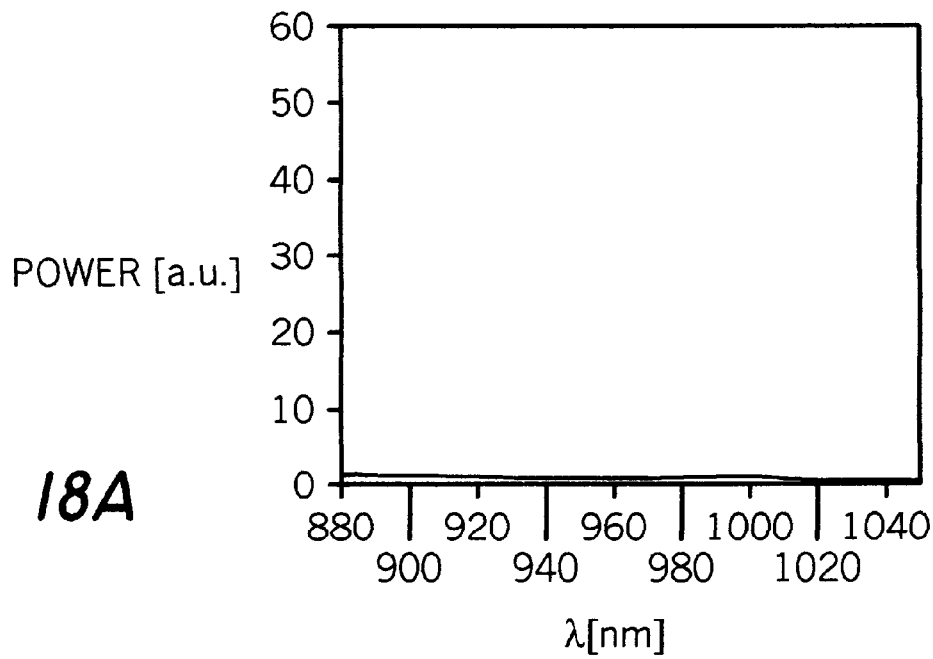
Figure 18B:
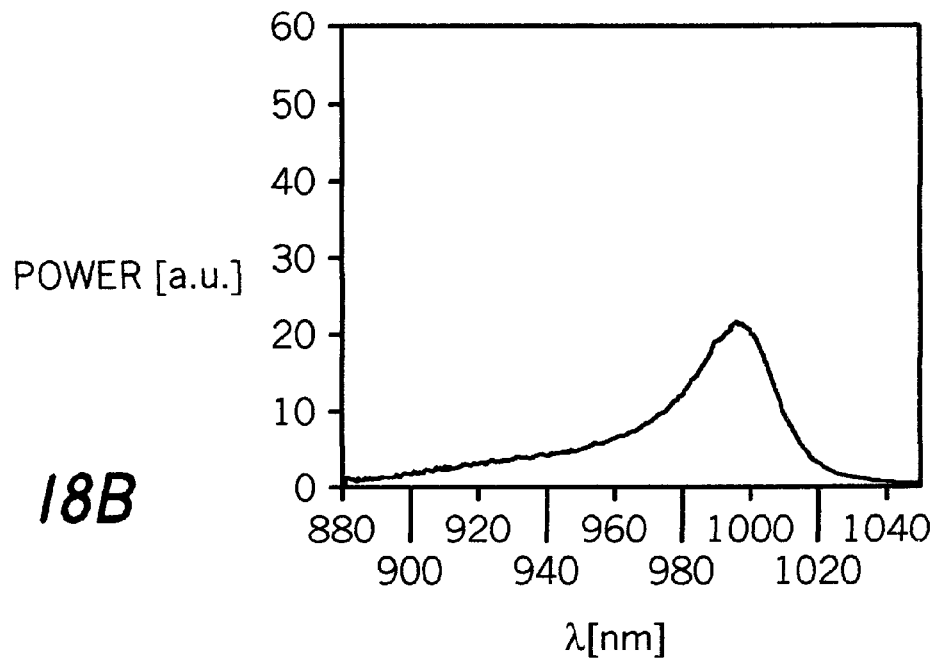
Figure 18C:
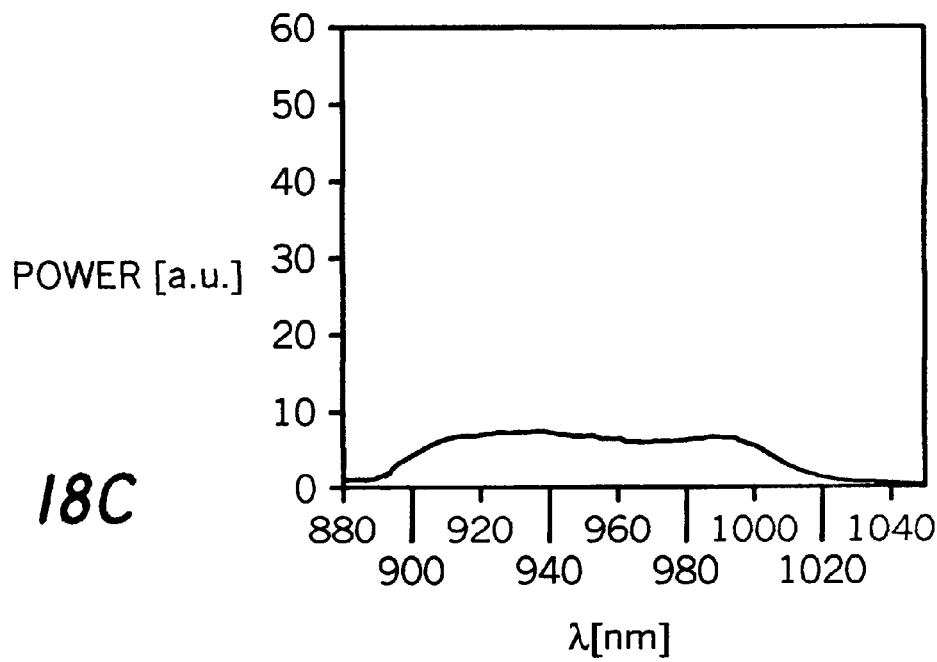
Figure 18D:
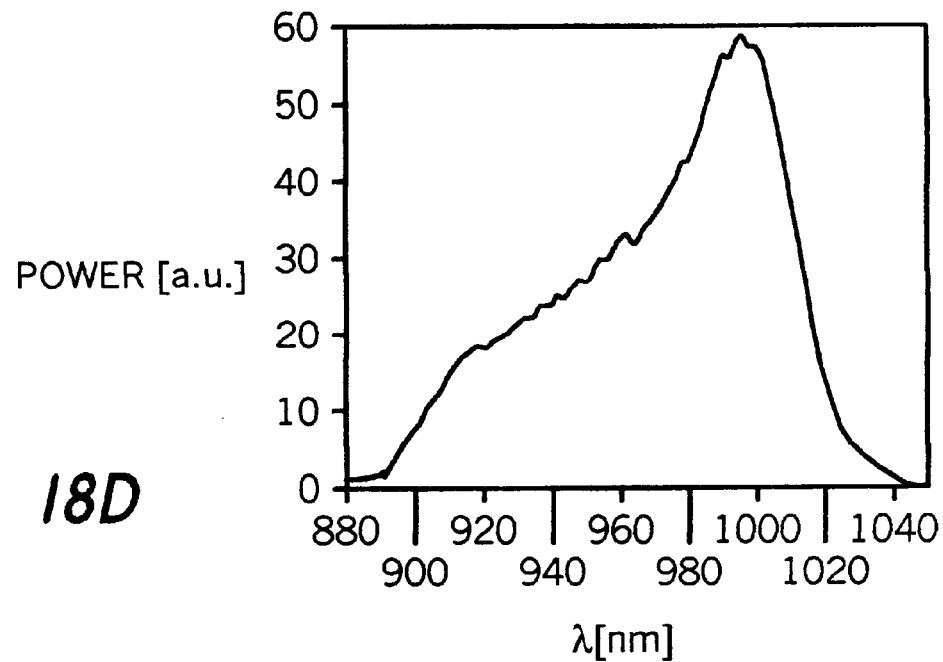

FIG. 17 is a block diagram of an experimental setup used for photoluminescence measurements.

FIG. 18 is a graph of the measured photoluminescence spectra: (a) unprocessed wafer; (b) half-processed wafer; (c) unpatterned structure (d) pattern with a=250 nm and g=160 nm.

Figure 19:
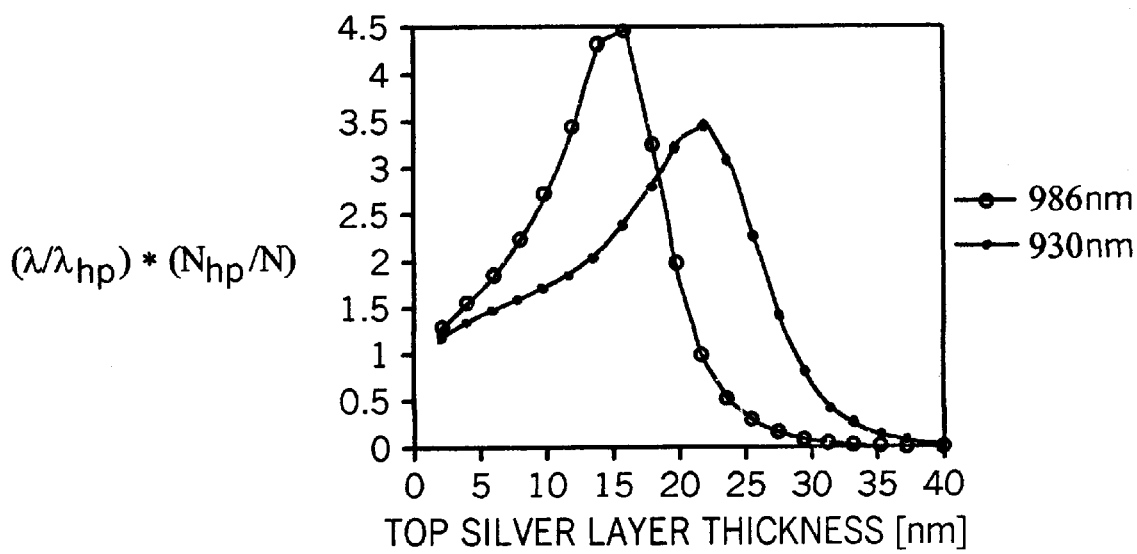
Figure 20:
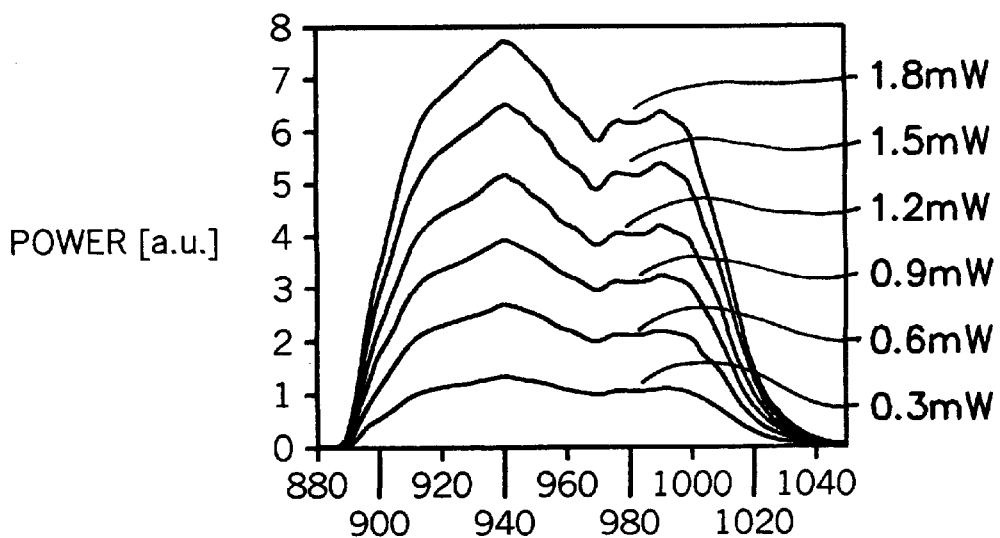

FIG. 19 is a graph of the ratio of γ factors for the unpatterned metal clad microcavity and the half-processed structure FIG. 20 is a diagram of the measured PL spectra of the unpatterned metal clad microcavity taken at different pumping levels.

DETAILED DESCRIPTION OF THE PREFERRED EMBODIMENTS

The invention is directed to a procedure for fabricating metal clad semiconductor microcavities with periodic texturing of the top, semitransparent metal layer. The emission properties of light-emitting diodes are enhanced by coupling to surface plasmons. The semiconductor emitter layer of the light-emitting diode is thinner than $\lambda/2$ and is sandwiched between two metal films. A periodic pattern is defined in the top semitransparent metal layer by lithography with the result that it efficiently couples out the light emitted from the semiconductor and simultaneously enhances the spontaneous emission rate. Extraction efficiencies of up to 35% and Purcell factors of 4.5 obtainable. Photoluminescence intensities of up to 46 times higher in fabricated structures compared to unprocessed wafers are obtained. The increased light emission is due to an increase in the efficiency and an increase in the pumping intensity resulting from trapping of pump photons within the microcavity.

Designs of the grown wafers in two illustrated embodiments are shown in Table 1.

TABLE 1

Layers Of The Grown Wafers

| | Layer | Wafer 1 | Wafer 2 |
|---|---|---|---|
| 8 | p-GaAs CAP | 25 nm | 10 nm |
| 7 | p-Al$_x$Ga$_{1-x}$As, x < 0.3 | 25 nm | 20 nm |
| 6 | undoped GaAs | 20 nm | 10 nm |
| 5 | undoped In$_{0.2}$Ga$_{0.8}$As quantum well | 8 nm | 8 nm |
| 4 | undoped GaAs | 20 nm | 10 nm |
| 3 | n-Al$_x$Ga$_{1-x}$As, x < 0.3 | 25 nm | 20 nm |
| 2 | n-GaAs cap | 25 nm | 10 nm |
| 1 | undoped AlAs (sacrificial layer) | 100 nm | 100 nm |
| 0 | undoped GaAs substrate | — | — |

Figure 1A:
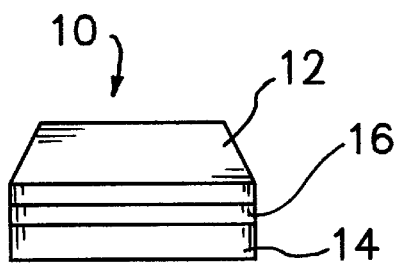
FIGS. 1a–h illustrate the fabrication procedure in which there is provided. a) thick silver layer deposition; b) epitaxial liftoff; c) Van der Waals bonding onto silver coated silicon substrate; d) thin silver. layer deposition; e) PMMA deposition and patterning using e-beam lithography; f) pattern transfer to thin silver layer using Ar+ ion milling, g) PMMA removal.
Figure 1B:
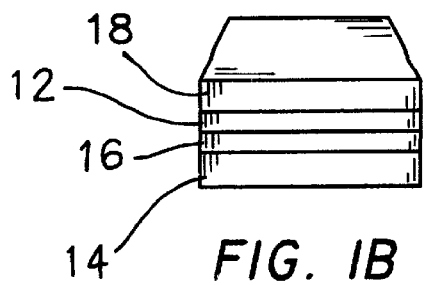
Figure 1C:
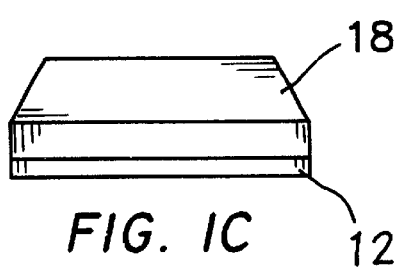
Figure 1D:
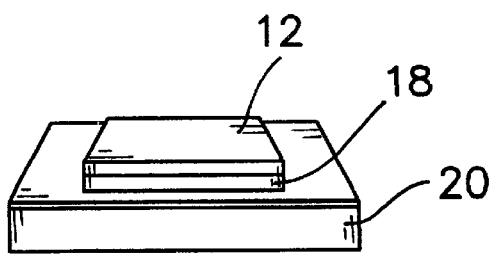
Figure 1E:
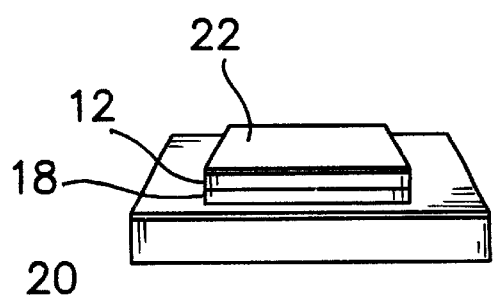
Figure 1F:
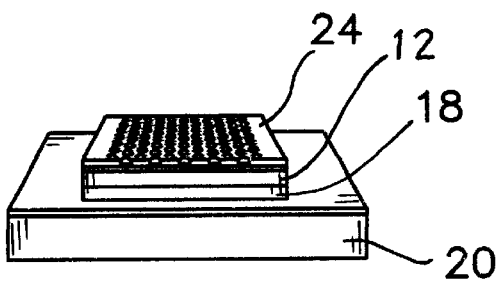
Figure 1G:
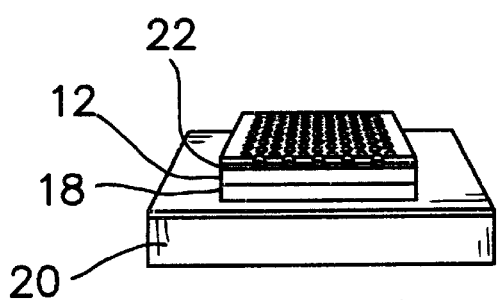
Figure 1H:
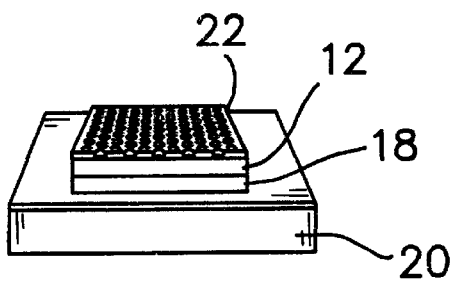
Figure 2:
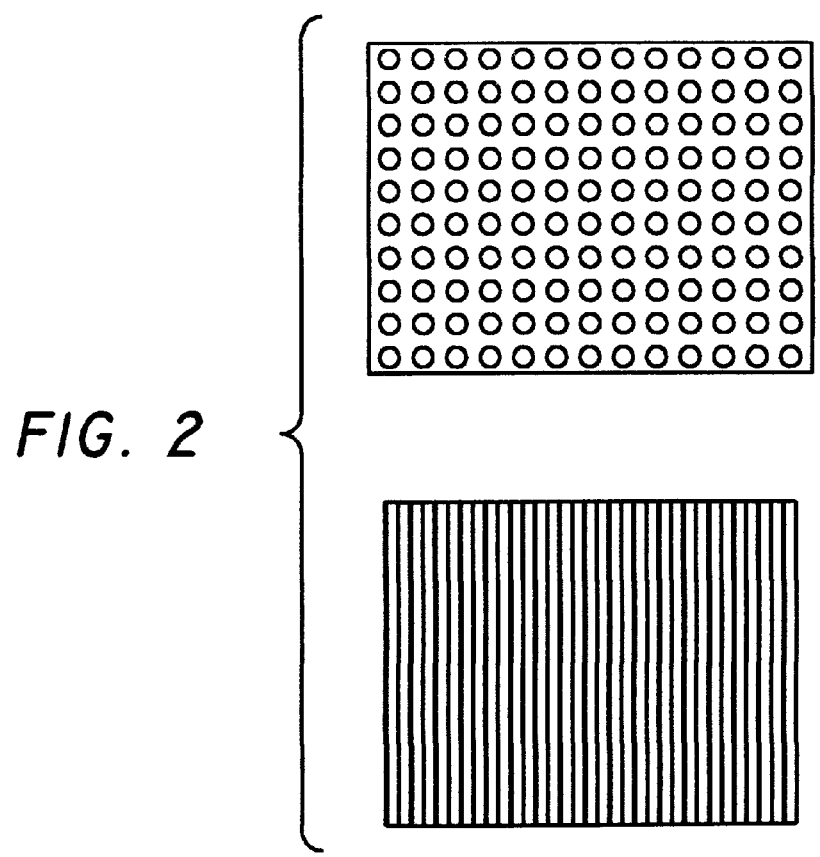
FIG. 2 is a top plan view of fabricated patterns in a top silver layer as defined by the process of FIGS. 1a–h. Light areas correspond to regions where silver was removed during the Ar+ ion milling process.

Wafers, generally denoted by reference numeral 10, were designed for fabrication electrically pumped devices and p and n doped layers were included as shown in FIGS. 1a–h. Layers 2 to 8 in Table 1 form a membrane 12 that will be lifted off and sandwiched between two metal layers described below. The total membrane thickness was approximately 150 nm for the first wafer and 90 nm for the second one. The emission from the InGaAs/GaAs quantum well, layer 5 in Table 1, is centered at 986 nm, which corresponds to conduction to heavy hole band transitions (C-HH). There is also a peak at 930 nm, corresponding to conduction to light hole band transitions (C-LH), which becomes more prominent at high pumping levels. C-HH transitions couple to electric fields polarized in the QW plane (x-z plane). On the other hand, C-LH transitions couple twice as strongly to electric fields with polarization perpendicular to the quantum well plane (y direction) than to those polarized in the quantum well plane. In the classical spontaneous emission model, C-HH transitions are represented with parallel dipoles, while C-LH transitions are represented with both parallel and perpendicular dipoles, weighted by factors $1/3$ and $2/3$, respectively. The fabrication procedure is described in FIGS. 1a–h. A 100 nm AlAs layer 16, layer 1 in Table 1, is disposed on a GaAs substrate 14, layer 0 in Table 1 as shown in FIG. 1a. A thick silver mirror 18 is deposited (d>1.5 $\mu$m) on top of the grown wafer shown in FIG. 1b. Metal layer 18 is also used as a mechanical support during the membrane liftoff. Membrane 12 is removed from its substrate by dissolving sacrificial AlAs layer 16 in 8.2% hydrofluoric acid (HF) diluted in water as shown in FIG. 1c. HF attacks AlAs very selectively over $Al_xGa_{1-x}As$ for x<0 4. The lifted-off membrane 12 (layers 2–8 of Table 1) with thick silver layer 18 on top is then Van der Waals bonded onto a silver coated silicon wafer 20 and the silver on the lift-off film of layer 18 bonds to the silver coated on the silicon support wafer 20 as shown in FIG. 1d. Another 20 nm to 40 nm thick silver layer 22 is then deposited on top of the nGaAs cap as shown in FIG. 1e. 100 nm thick high molecular weight PMMA (polymethylmethacrylate) layer 24 is then spun on top of the thin metal layer 22 and subsequently baked on a hot plate at 150° C. for 20 minutes. A desired pattern (a square array of holes or a one dimensional grating) is beam-written on PMMA layer 24 by electron beam lithography in a Hitachi S-4500 electron microscope as shown in FIG. 1f. The resulting patterns are approximately 50 $\mu$m×50$\mu$m in size, and the exposed PMMA layer 24 is developed in a 3:7 solution of 2-ethoxyethanol:methanol for 30 seconds. Then, the pattern is transferred into the top semitransparent metal layer 22 using Ar+ ion milling at a beam voltage of 1500V as shown in FIG. 1g. Finally. the remaining PMMA layer 24 may be dissolved in acetone as shown in FIG. 1h. Corresponding SEM pictures showing the top view of fully processed wafers 10 are shown in the top plan view of FIG. 2 where light areas correspond to regions where silver was removed. The structure shown in FIG. 1a is the unprocessed wafer 10 and the one in FIG. 1d is referred to as the half-processed wafer 10. FIG. 1e represents the unpatterned metal clad microcavity and finally, the structure shown in FIG. 1h is the fully processed wafer 10.

While the theory of the enhanced emission is not the subject of the invention, the scope and breadth of the invention can better be appreciated if the theory of its operation is understood.

A. The Finite-Difference Time-Domain (FDTD) Analysis Of Metallic Structures At Optical Frequencies The FDTD method is used to theoretically analyze electromagnetic fields within metal clad microcavities. In order to accurately model metals at optical frequencies, it is necessary to make some changes to the standard Yee's FDTD scheme. Electromagnetic fields in metals are described by adding a current vector, J, to the Maxwell curl equations (Drude model):

$$xH = \varepsilon_0 \frac{\partial E}{\partial t} + J \quad (1)$$

$$xE = -\mu_0 \frac{\partial H}{\partial t} \quad (2)$$

$$\frac{\partial J}{\partial t} + vJ = \varepsilon_0 \omega_p^2 E \quad (3)$$

where $\omega_p$ is the plasma frequency of a metal and v, is the corresponding damping rate. We assume that metal is silver with parameters $\hbar\omega_p$=8.8 eV (i.e. $\lambda_p$=140 nm) and $\hbar v$=0.05 EV. In part of the FDTD calculations, we neglect metal absorption losses by applying v=0. Non-metallic regions are described with standard Maxwell curl equations:

$$xH = \varepsilon(r) \frac{\partial E}{\partial t} \quad (4)$$

$$xE = -\mu_0 \frac{\partial H}{\partial t} \quad (5)$$

The FDTD method consists, basically, of discretization of equations (1) to (5) in space and time. FDTD calculations of band diagrams and filtering of electromagnetic fields for a mode of interest are well known. Depending on the problem, different boundary conditions are applied to boundaries of the computational domain, such as the Mur's absorbing boundary conditions or Bloch boundary conditions. The spatial discretization step is critical in this case, keeping in mind that the penetration depth of electromagnetic field into metals can be of the order of only tens of nanometers. This implies that large amounts of memory are required for computation unless variable cell sizes are used. We have performed two dimensional analyses to design our structures, with discretization steps of 3 nm unless noted otherwise.

B. Electromagnetic Fields And Band Diagrams Of Unpatterned Metal Clad Microcavities First, we analyze the band diagram of the metal clad microcavity shown in FIG. 3. Parameters of the analyzed structure are chosen so that they correspond to geometries which have been actually fabricated and measured. Semiconductor membrane 12 was 90 nm thick (which corresponds to wafer 2), with a refractive index of n=3.5. The top semitransparent silver layer 22 was 40 nm thick, and the bottom silver layer 18 was 200 nm thick. Absorption losses in silver were not included in any of band diagrams calculations, since if bands are too lossy, it is difficult to recover them from spectra obtained in FDTD analyses. In the wavelength range of our interest (986 nm), the imaginary part of silver dielectric constant is still much smaller than its real part, and positions of bands can be determined approximately by assuming that v=0. The analyzed structure is surrounded by air on top and bottom and the slab is infinite in the horizontal plane. We assume that the structure is "periodic" in the x direction with an artificial periodicity of 50 nm and analyze only one unit cell. Mur's absorbing boundary conditions are applied to boundaries in the y direction, while Bloch boundary conditions are applied to boundaries in the x direction. The used discretization step was equal to 1 nm.

Figure 3:
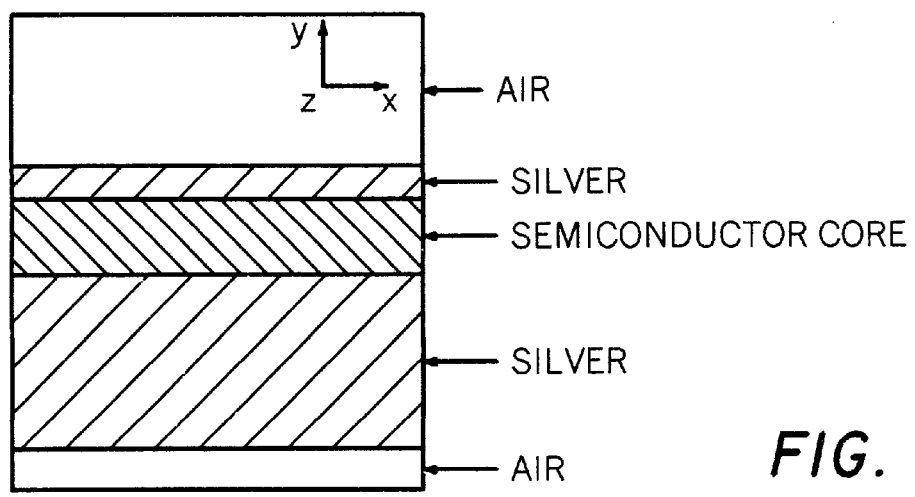
FIG. 3 is a diagrammatic side cross-sectional view of an unpatterned metal clad microcavity analyzed using the FDTD method. The structure is infinite in the z direction, Mur's absorbing boundary conditions are applied to boundaries in the y direction and Bloch boundary conditions are applied to boundaries in the x direction.

P-polarized (TM) light has x and y components of electric field and the z component of magnetic field, while s-polarized (TE) light has x and y components of magnetic field and the z component of electric field. The band diagram for the structure shown in FIG. 3 is shown in FIG. 4. The splitting between the long and short range coupled SPP branches of the top silver layer 22 was not observed for the semitransparent silver layer thickness used in FDTD calculations (40 nm) and for the used frequency resolution of $$2.3 \; 10^{-3} \frac{\lambda_p}{\lambda}.$$

Let us analyze electromagnetic fields in the middle of membrane 12, where the quantum well (layer 5 in Table 1) is located in real structures. The $TM_{-1}$ mode has a very weak parallel (Ex) and a strong perpendicular (Ey) electric field component there, as shown in FIG. 5. It follows that perpendicular dipoles positioned in the quantum well couple strongly to this mode. On the other hand, the TMo mode has a strong parallel (Ex) and a weak perpendicular (Ey) electric field component in the middle of the membrane, as can be seen in FIG. 6. FIG. 6 represents the TMo mode at cutoff where it is degenerate to the TEo mode and the y component of its electric field is equal to zero. Furthermore, the TEo mode has only its parallel (Ez) component of electric field not equal to zero. Therefore, parallel dipoles in the quantum well couple strongly to TMo and TEo modes.

Using the one dimensional finite difference method, we evaluated the cutoff frequency of TEo and TMo modes when absorption losses in both metal and semiconductor were included and concluded that it was positioned at $$\frac{\lambda_p}{\lambda} = 0.15$$

instead of 0.16, as in the lossless band diagram shown in FIG. 4. Absorption losses also reduce the quality factors of modes. Using the FDTD method, we evaluated Q-factors corresponding to several $$\left( k_x, \frac{\lambda_p}{\lambda} \right)$$

points in the band diagram including metal absorption and they were in the range between 5 and 7. Therefore, for lossy bands, we cannot talk about an abrupt cutoff at $$\frac{\lambda_p}{\lambda} = 0.15.$$

Instead, the cutoff is gradual and extends from about $$\frac{\lambda_p}{\lambda} = 0.13 \text{ to } 0.15.$$

In normalized units, the C-HH transitions peak at 986 nm corresponds to $$\frac{\lambda_p}{\lambda} = 0.14.$$

From the previous discussion, it follows that these transitions couple mostly to TEo and TMo modes in the gradual cutoff. Their coupling to the $TM_{-1}$ mode is very weak. On the other hand, the C-LH transitions peak at 930 nm corresponds to $$\frac{\lambda_p}{\lambda} = 0.15$$

and this emission couples strongly to the $TM_{-1}$ mode. However, one third of C-LH dipole transitions are in plane and they can couple to TEo and TMo modes.

Figure 9B:
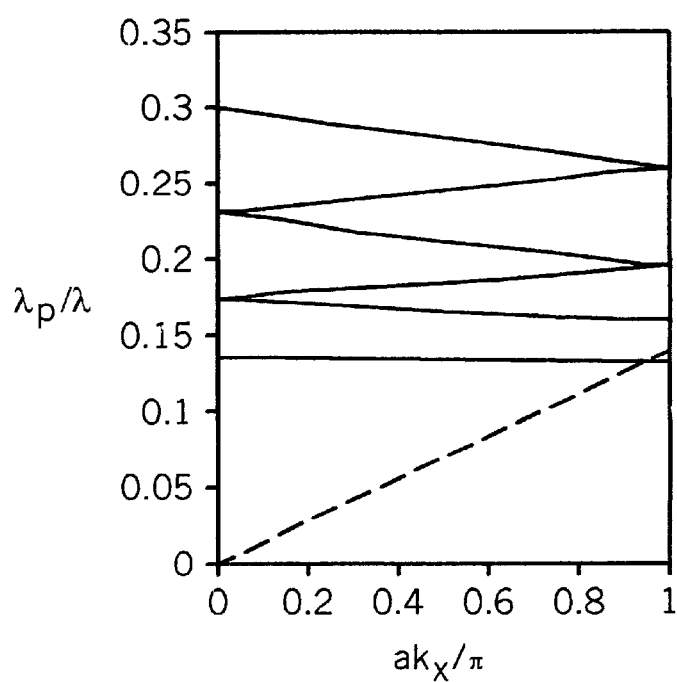

C. Electromagnetic Fields And Band Diagrams Of Metal Clad Microcavities With A Patterned Semitransparent Metal Layer Perpendicular dipoles in metal clad microcavities couple strongly to the $TM_{-1}$ mode located below the light line, as shown in the band diagram in FIG. 4. Therefore, their emission cannot be extracted outside an unpatterned microcavity. Usually, the TM, mode is, considered a loss mechanism in metallic structures. However, we can modify the band diagram and bring parts of the $TM_{-1}$ branch above the light line by patterning of the top semitransparent metal layer. The introduction of periodicity into one of metallic layers dramatically changes the band diagram shown in FIG. 4. The band diagram is folded back info its first Brillouin zone at the edges of which the band gap for surface plasmon waves appears. This means that bands previously located below the light line can now be brought above it. The effect of the periodic patterning can also be analyzed using the two dimensional FDTD. We introduce a one dimensional grating consisting of stripes (infinite in the z direction) within the top metal layer. The pattern is formed by periodically modulating the top metal layer thickness between 40 nm and 0 nm. When the top layer is modulated between 20 nm and 0 nm, results are approximately the same. We analyze three structures, with the same parameters as those that we fabricated and measured. Their grating periodicities are 250 nm, 480 nm and 650 nm, with a 160 nm wide gap between silver stripes. The schematic diagram of these structures is shown in FIG. 7 and the calculated band diagrams for TE and TM polarizations are shown in FIGS. 8, 9 and 10.

The indicator of how strongly the grating changes the band diagram of an unpatterned metal clad microcavity is the size of the band gap that opens at the edge of the Brillouin zone. Let us first consider band diagrams for the TM polarization. Clearly, in the frequency range of our interest $$\left( \frac{\lambda_p}{\lambda} \approx 0.14 \right)$$

only the grating with a periodicity of 250 nm strongly affects properties of the structure. We expect that this grating will extract the emission of perpendicular dipoles, while the other two analyzed structures will not show any significant improvement over an unpatterned metal clad microcavity. With the frequency resolution of $$2.3 \times 10^{-3} \frac{\lambda_p}{\lambda}$$

used in our FDTD calculations, we could not detect a band gap at $k_x=0$ and $$\frac{\lambda_p}{\lambda} \approx 0.14$$

for structures with periodicities of 650 nm or 480 nm. What about the TE polarization? A band with the cutoff frequency around 0.14 appears in TE band diagrams for all structures. As we will see from the electric field distribution, this branch corresponds to the combination of the TEo mode and the mode that resonates in the gap between silver stripes. For the smaller grating periodicity, gaps between silver stripes are closer to each other and behave as coupled cavities. Therefore, this mode can propagate in the x direction. On the other hand, for the larger grating periodicity (such as 480 nm), cavities are decoupled, this mode cannot propagate and the corresponding TE band is flat. For the upper TE bands, the band gap does not appear at the edges of the Brillouin zone, meaning that grating has basically no effect there and the corresponding mode is simply the TE mode of the unpatterned structure.

First we filtered the TM polarized fields with $k_x=0$ and $$\frac{\lambda_p}{\lambda} \approx 0.14$$

for the structure with a periodicity of 250 nm, in order to confirm that this metal layer patterning produces the out-coupling of radiation. From the band diagram shown in FIG. 8 we see that there are two modes in the filtered frequency range. The intensities of x and y components of electric field are shown in FIG. 11. By comparison with the fields from FIG. 5, we see that radiation now escapes from the microcavity, even though the gap between silver stripes is smaller than a wavelength. Moreover, the x component of electric field is not negligible in the middle of membrane 12. This means that parallel dipoles positioned there and oriented in the x direction can also couple to this mode. On the other hand, the Ey field is still strong within the membrane, which means that perpendicular dipoles still couple to this mode strongly.

Then we filtered the TM polarized fields with $k_x=0$ and $$\frac{\lambda_p}{\lambda} \approx 0.15,$$

for the structure with a periodicity of 650 nm. The electric field intensity patterns are represented in FIG. 12. They look exactly like the $TM_{-1}$ mode with $k_x=6\pi/a$ of the unpatterned structure, except underneath gaps between silver stripes. The electromagnetic field intensity outside the microcavity is small. This was expected from the band diagram for the TM polarization for this structure, shown in FIG. 10, since we could not detect opening of the band gap in the filtered frequency range.

We also filtered the TE polarized fields with $k_x=0$ and $$\frac{\lambda_p}{\lambda} \approx 0.14$$

for the structures with periodicities of 250 nm and 480 nm. The corresponding Ez field distributions are shown in FIG. 13. The mode looks like the TEo mode that also resonates in the gap between silver stripes, and is radiated out of the cavity through the spacing between stripes. Since the density of these spacings is larger for the structure with a periodicity of 250 nm, the mode will be extracted out of the cavity more efficiently.

Therefore, the patterning of the top metal layer has a strong effect on properties of both TE and TM band diagrams. By choosing a grating appropriately, such as in the case of the analyzed structure with a periodicity of 250 nm, both the emission of perpendicular and parallel dipoles can be extracted out of the microcavity.

D. Extraction Efficiency and External Efficiency.

The external efficiency (Next) for planar structures without metal patterning can be evaluated using conventional methods such as described in J. A. E. Wasey and W. L. Barnes, "Efficiency of spontaneous emission from planar microcavities," Journal of Modern Optics, vol. 47, no. 4, pp. 725–741, 2000. We calculated the external efficiency for the unpatterned metal clad microcavity with a 90 nm thick semiconductor membrane 12, as a function of the top, semitransparent silver layer thickness 22, and for the collection angles of 30° or 90° with respect to the normal to the surface. The refractive index used for silver was n=0.14+ 6.94 i. The emitter was a parallel or a perpendicular dipole positioned in the middle of membrane 12 and oscillating at the wavelength of 986 nm or 930 nm. The calculated external efficiencies corresponding to perpendicular dipoles are negligible, while the external efficiencies of parallel dipoles are shown in FIG. 14. For the unprocessed wafer, we calculate that $\eta_{ext}$ corresponding to parallel dipoles positioned 45 nm from the semiconductor/air interface is 2% into the 90° collection angle, or 0.5% into the 30° collection angle, both at wavelength of 986 nm and 930 nm. $\eta_{ext}$ for perpendicular dipoles in the unprocessed wafer is negligible.

For structures with a patterned top metal layer, extraction efficiencies, $\eta_x$, are evaluated using the FDTD method. The rate at which the electromagnetic field energy is lost from the cavity is described by the radiation quality factor, Qr $$Q_r = \frac{\omega_0 W}{P_r}$$

where W represents the electromagnetic field energy stored in the cavity, $\omega_o$ is the radial frequency of a mode and $P_r$ is the power radiated outside the cavity. On the other hand, the non-radiative quality factor $Q_{nr}$ describes the rate at which the stored electromagnetic energy decreases due to different non-radiative mechanisms such as absorption losses:

$$Q_{nr} = \frac{\omega_0 W}{P_{nr}}$$

where $P_{nr}$ represents the power lost non-radiatively. The total quality factor Q is defined as:

$$\frac{1}{Q} = \frac{1}{Q_r} + \frac{1}{Q_{nr}}$$

and the photon lifetime is defined as:

$$\tau = \frac{Q}{\omega_o}$$

T can also be expressed as a combination of non-radiative and radiative lifetimes:

$$T = \frac{Q_r}{\omega_o}$$

$$T_{nr} = \frac{Q_{nr}}{\omega_o}$$

$$\frac{1}{\tau} = \frac{1}{\tau_r} + \frac{1}{\tau_{nr}}$$

The extraction efficiency $\eta_x$ is the probability that a photon will escape the cavity and can be defined as:

$$\eta_x = \frac{\frac{1}{\tau_r}}{\frac{1}{\tau_r} + \frac{1}{\tau_{nr}}}$$

$\eta_x$ can also be expressed in terms of the introduced quality factors as $$\eta_x = \frac{Q}{Q_r}$$

We calculated $\eta_{ext}$ for the structure with a periodicity of 250 nm. The only non-radiative loss mechanism in these calculations is the absorption in metal. For the folded $TM_{-1}$ mode, whose field distribution is shown in FIG. 11, we calculated $Q_r$ between 30 and 50, Q=6 and $\eta_x$ between 12% and 20% $\eta_x$. For the TE mode shown in FIG. 13, we calculated $Q_r=15$, $Q_{nr}9$, Q=5.5 and $\eta_x=37\%$. From the band diagram shown in FIG. 8, we can see that the emission in the frequency range from 0.14 to 0.15

$$\left(\text{in units of } \frac{\lambda_p}{\lambda}\right)$$

goes into the 30° escape cone, if coupled to TM modes. However, coupling to TE modes does not improve the directionality and the emission goes into the 90° cone.

For the structures with periodicities of 650 nm or 480 nm, we estimated that Q~7, while the extraction efficiencies were approximately the same as in the unpatterned cavity case. As we will see later, the calculated Q values match our experimental results.

Therefore, for the structure with a periodicity of 250 nm, the extraction efficiency larger than 30% can be achieved in the presence of a grating. The filtered modes have low quality factors and overlap with both C-HH and C-LH emission peaks. From the field patterns for the TM mode shown in FIG. 11, we see that this mode can extract the emission of both perpendicular dipoles and parallel dipoles oriented in the x direction. On the other hand, the filtered TE mode extracts the emission of parallel dipoles oriented in the z direction.

One should also note low values of $Q_{abs}$, ranging from 6 to 10 and resulting from a significant metal absorption. A reduction in the absorption and a further increase in the extraction can be achieved by designing a device that operates at longer wavelengths.

E. Purcell Factor

The Purcell factor (Fp) is defined as the spontaneous emission rate enhancement in a microcavity relative to a bulk semiconductor. We also evaluated Fp analytically for unpatterned structures using the method described in J. A. E. Wasey and W. L. Barnes, "Efficiency of spontaneous emission from planar microcavities," Journal of Modern Optics. vol. 47, no. 4, pp. 725–741, 2000. The result is shown in FIG. 15 for parallel and perpendicular dipoles.

For complicated geometries obtained after the top metal layer patterning, it is possible to use the FDTD-based three dimensional analysis of Purcell factor proposed in Y. Xu, J. S. Vuckovic, R. K. Lee, O. J. Painter, A. Scherer, and A Yariv, "Finite-difference time-domain calculation of spontaneous emission lifetime in a microcavity," Journal of the Optical Society of America B. vol. 16, no. 3, pp. 465–474, 1999. However, this requires large amounts of computer memory. Instead, it can be roughly assumed that Purcell factors of fully processed, patterned structures have their values between those of the half-processed structure and the flat (unpatterned) metal clad microcavity.

F. Pump Power Transmission Through The Top Surface

In our experiments, we pump structures optically from top using a semiconductor laser diode emitting at 830 nm. Therefore, it is important to determine what percentage of the s-polarized pump beam is transmitted into the structure.

Let us denote by T the transmission through the top surface at the pump wavelength. T can be evaluated from Fresnel equations for an unpatterned top layer. The calculated T, as a function of the silver layer 22 thickness, is shown in FIG. 16. The transmission through the air/semiconductor interface is equal to 70%. For structures with metallic grating on top, there is no increase in the pump power transmission due to diffraction at the patterned metal layer, and transmission coefficients can be approximated by weighting previously calculated coefficients with the filling factor of the grating. In order to prove that this is correct, we analyzed (using the two dimensional FDTD method) the transmission through the metallic grating sitting on top of a semiconductor. The metal layer had the same parameters as the previously simulated grating with a periodicity of 250 nm and absorption losses were included. We analyzed one unit cell of the structure and applied Mur's absorbing boundary conditions to boundaries in the y direction and periodic boundary conditions (i.e. Bloch boundary conditions with $k_x=0$) to boundaries in the x direction. A parallel dipole (oriented in the x or z direction) was located 400 nm above the metal surface, in the air and above the middle of the gap between stripes. The frequency of dipole oscillations matched the pump frequency. We calculated the power of the dipole source, as well as the power transmitted into the semiconductor, by integrating the Poynting's vector along a chosen surface. Without metal on top, the calculated transmission was T=0.7 for both x oriented or z oriented dipole, as expected from Fresnel equations. However, in the presence of the metallic grating, we calculated T=0.5 for an x oriented dipole and T=0.24 for a z-oriented dipole. This means that the average transmission in the presence of a grating is T=0.375. By weighting transmission coefficients for the flat metal layer on top (40 nm thick) and for the air/semiconductor interface with the filling factor of the grating, we obtain T=0.47.

G. Trapping Of Pump Photons Within Microcavity

We can define N as a factor that measures an increase in the pumping intensity resulting from the trapping of pump photons within the microcavity. N is proportional to an average number of times that a pump photon crosses the quantum well before being absorbed in it or lost through other nonradiative loss mechanisms. The trapping of pump photons within the microcavity effectively increases the pumping intensity. since the probability that a photon excites an electron transition into an upper band is proportional to the number of times that it crosses the quantum well. The unprocessed wafer has N=1, since there is no mode within the structure that pump photons can couple to and photons not absorbed in the quantum well are lost when they reach the GaAs substrate. However, in the case of half-processed or fully processed wafers 10, the pump power transmitted through the top surface can couple to an s-polarized guided mode of the structure. For fully processed wafers, this can be easily seen from the previously calculated TE band diagrams $$\left(\text{the pump wavelength is equal to 0.17 in units } \frac{\lambda_p}{\lambda}\right).$$

For the half-processed wafer 10, we performed the one dimensional finite-difference analysis and showed that an s-polarized guided mode existed at the wavelength of 830 nm.

Let us denote by α (in units [1/cm]) the loss coefficient for the guided mode that pump photons couple to. The angle with respect to the y axis of this mode's total internal reflection is defined as:

$$\theta = \arcsin\left(\frac{k_x}{k}\right)$$

where $k_x$ is the wavevector component in the direction of propagation (x) and k is the amplitude of the wavevector. Then, it follows that N is proportional to:

$$N = \frac{1}{\alpha d \tan(\theta)} = \frac{\sqrt{k^2 - k_x^2}}{\alpha d k_x}$$

where d is the membrane thickness. N cannot be considered the exact value of the increase in the pumping intensity, since we arbitrarily chose to evaluate it until the trapped beam energy drops to 10% of its initial value. However, it is the indicator that the trapping happens and how strong it is. We analyze the half-processed wafer and the flat metal clad microcavity using the one dimensional finite difference method (absorption losses in both metal and semiconductor were included, former being dominant). From the obtained values of α and $k_x$ for the guided TE mode at 830 nm, we estimate N. The unpatterned metal clad microcavity has N=12, even when the top silver layer thickness varies between 20 nm and 40 nm. For the half processed structure, consisting of a lifted off membrane on top of a thick bottom metal layer, we also estimate N=12. Therefore, in both structures, there is an equal increase in the pumping intensity resulting from the pump beam trapping in the microcavity.

IV. Measurements

The experimental setup used for the photoluminescence measurements is shown in FIG. 17. Samples 26 are mounted on an X-Y-Z stage 28 and optically pumped at a 90° incident angle. The pump source is a semiconductor laser diode 30 emitting at 830 nm, pulsed with a period of 3 μs and a pulse width of 2.5 μs. A non-polarizing cube beamsplifter 32 centered at 830 nm is used to bring 50% of the pump beam to detector 34 and to measure the external pump power. The other 50% of the beam is focused to a 10 μm spot on sample 26 by using a 100× objective lens 36. The same objective lens 36 is also used to collect the emitted light. The collection angle is 30° with respect to normal The collected emission is then focused in lens 38 and detected using a fiber 40 coupled spectrum analyzer 42.

We have measured the output from the unprocessed as grown wafer 10, from the half-processed wafer 10, and from the fully processed wafers 10, with a patterned or unpatterned thin metal layer on top. The first set of measurements was performed on the 150 nm thick wafer 10, denoted as wafer 1 in Table 1. The fully processed structures had a top metal layer 22 patterned with a two dimensional square array of holes. Within holes, silver layer 22 was thinned from 40 nm to 10 nm. During the Ar+ ion milling process, pinholes with diameter of 100 nm were also formed in centers of fabricated holes. We obtained the brightest light emission from a square array of holes with a 650 nm periodicity and a hole radius of 210 nm. Using the same external pump power, we measured a 5 times higher photoluminescence intensity at 986 nm from the fully processed structure compared to unprocessed wafer 10. We need to estimate parameters of measured structures (e.g. their extraction efficiencies), however, with two dimensional theoretical models, we could not adequately simulate them. Even though these measurements could not be fully theoretically explained, they lead us to several very important conclusions. One of these was that pinholes in the semitransparent metal 22 improve light extraction. For this reason, we decided to perforate the top metal layer 22 completely. In order to be able to explain our results with theoretical models, we also decided to fabricate one dimensional instead of two dimensional patterns. Furthermore, since large spontaneous emission enhancements can be obtained at or below the cutoff for TEo and TMo modes, we decided to use the thinner design of wafer 2 in Table 1, where 90 nm thick membranes are defined after the liftoff. (For wafer 1 in Table 1, membrane 12 is thicker which shifts bands downwards in frequency and structures operate above the cutoff for TEo and TMo modes.)

We fabricated a series of gratings in top metal layer 22, that was 25 nm thick (within a±10% range). Each grating is characterized with a periodicity (a) and a gap (g) between silver stripes. Between stripes, silver was completely removed by Ar+ ion milling. During the thin silver layer deposition, part of the sample surface was masked, in order to also produce half-processed regions. The measurement results from wafer 2 are summarized in Table 2, peak external pump power was, 2.2 mW: $E_{up}$(986 nm) and $E_{hp}$(986 nm) denote the photoluminescence enhancements at 986 nm of the fully processed wafer with respect to the unprocessed and to the half-processed wafers, respectively. Tabulated values are raw measured data and have not been resealed. For all fully processed wafers, including the unpatterned metal clad microcavity, a full half wave maximum is in the range of 60 nm to 110 nm. Therefore, their quality factors are between 10 and 15. For the half-processed wafer 10, a full half wave maximum is 32 nm. Because of a bulk emission tail at lower wavelengths, a luminescence peak at 930 nm for unprocessed wafers 10 cannot be clearly resolved. All tabulated results were averaged over five measurements. The spectra for unprocessed, half-processed and fully processed wafers are shown in FIG. 18. The PL peak of the unprocessed wafer at 986 nm was normalized to 1. A filter was applied before the detection to cut off wavelengths below 890 nm. A deposition of metal at one or at both sides of a 90 nm thin semiconductor membrane 12 does not seem to induce additional strain, since for all measured structures luminescence peaks are located at wavelengths of 986 nm and 930 nm.

In order to explain measurement results, we have to take into account several effects: (A) the increase in the pumping intensity resulting from the trapping of pump photons within a microcavity; (B) the spontaneous emission enhancement and (C) the change in the extraction efficiency. In our explanation, we will use theoretical results presented above. The spontaneous emission reabsorption is not very efficient because of the small optical confinement factor in the quantum well and the photon recycling effect can also be neglected.

If Pin denotes the external pump power and Pout denotes the power emitted from the device, then:

$$\frac{P_{out}}{P_{in}} \approx \gamma$$

where γ is defined as:

$$\gamma = \beta(f_{\parallel} F_{p,\parallel} \eta_{ext,\parallel} + f_{\perp} F_{p,\perp} \eta_{ext,\perp})$$

For patterned structures, the first term should be separated into contributions of parallel dipoles in the x direction and in the z direction, since they have different $\eta_{ext}$. $f_{\parallel}$ and $f_{\perp}$ are fractions of dipole transitions that are in the quantum well plane or perpendicular to it. Their values at the main peak of 986 nm are $f_{\parallel}=1$ and $f_{\perp}=0$ and at 930 nm are $f_{\parallel}=\frac{1}{3}$ and $f_{\perp}=\frac{2}{3}$. Furthermore, ½ of parallel dipoles are oriented in the x direction and the other half in the z direction. β is the equivalent pumping intensity that can be expressed as:

$$\beta = TN$$

Let us label the half-processed wafer 10 by a subscript hp, the unprocessed wafer using a subscript up and denote the photoluminescence (PL) enhancement by E. If the input pump powers are the same (i.e. Pin equal), PL enhancements can be expressed as:

$$E_{hp} = \frac{\gamma}{\gamma_{hp}}$$

$$E_{up} = \frac{\gamma}{\gamma_{up}}.$$

The half-processed wafer 10 has a 21-fold PL intensity enhancement at 986 nm relative to the unprocessed wafer. This is a result of the increased extraction efficiency into the collection angle of 30° (by a factor of 2), the Purcell factor of $F_{p,\parallel}=1.5$ and the higher pumping intensity resulting from pump photons trapping within the structure. Therefore, the pump trapping factor for the half-processed wafer is $N_{hp}=7$ The unpatterned metal clad microcavity has a 5.5-fold PL intensity increase at 986 nm and the prominent peak at 930 nm. Relative to the half-processed wafer. PL enhancements at 986 nm and 930 nm are equal to 0.26 and 1.5, respectively. In order to explain this result, we calculated Em.

TABLE 2

| a [nm] | g [nm] | E$_{up}$(986 nm) | E$_{hp}$(986 nm) |
|---|---|---|---|
| 250 | 160 | 46 | 2.24 |
| 480 | 160 | 5.6 | — |
| 650 | 160 | 6.4 | — |
| 0 | 0 | 5.5 | — |

The photoluminescence measured from the structures fabricated from wafer 2. a is the one dimensional grating periodicity, while g denotes the gap between silver stripes. E$_{up}$(986 nm) and E$_{hp}$(986 nm) denote photoluminescence enhancements at 986 nm of the fully processed wafer with respect to the unprocessed and to the half-processed wafer, respectively. The last row corresponds to an unpatterned top metal layer.

The result is shown in FIG. 19. Parameters without a subscript refer to the unpatterned metal clad microcavity. For the top silver layer thickness of 27 nm, the theoretically estimated E$_{hp}$ values agree with the experimentally observed ones. For this silver layer thickness we have estimated theoretically F$_{p,\parallel}$(986 nm)=0.5, F$_{p,\parallel}$(930 nm)=2.1, $\eta_{ext,\parallel}$ (986 nm)=6% and $\eta_{ext,\parallel}$ (930 nm)=12% (into the 30° collection angle). Therefore, the increase in the PL intensity has to be a result of an increase in the efficiency, defined as Fp $\eta_{ext}$, which is 6 times larger than in the unprocessed wafer at 986 nm. Furthermore, the enhancement in the 930 nm peak comes from the Purcell enhancement and the improved extraction of parallel dipoles.

Since the transmission coefficient T of the unpatterned structure is at least 10 times smaller than the one of the half-processed structure for the top silver layer thickness larger than 25 nm, the stronger pumping of the unpatterned structure would require $$\frac{N}{N_{hp}} > 10$$

However, according to the FIG. 19 and for the experimentally observed PL enhancement at 986 nm, this would imply that $$\frac{\gamma N_{hp}}{\gamma_{hp} N} < 0.025,$$

which is possible only for thicker silver layers (thicker than 35 nm). This not the case in our structure and therefore, the enhanced peak at 930 nm cannot be a result of the strong pumping. In order to prove experimentally that the enhancement of the peak at 930 nm is not a result of the strong pumping, we measured the PL of the unpatterned microcavity at different pumping levels. The external pump power was controlled by changing the duty cycle. The peak at 930 nm remained prominent when the pumping level was reduced, as one could see from the results shown in FIG. 20. Structures with periodicities of 480 nm or 650 nm have a similar performance to the unpatterned metal clad microcavity, as we theoretically predicted. The structure with a periodicity of 250 nm has a 46-fold photoluminescence intensity enhancement at 986 nm relative to the unprocessed wafer. Clearly, we cannot determine exactly T and N factors for the patterned structure, but we can make a rough estimate and confirm that there is definitely an increase in the efficiency relative to the unprocessed wafer. Let us assume that the N factor is of the same order as that of the half-processed wafer, and use the theoretically estimated value of the transmission coefficient (T=40%) Then we estimate that the pumping intensity has increased 4 times relative to the unprocessed wafer. This means that there is a 12-fold increase in the efficiency (into the detection angle of 30°) compared to the unprocessed wafer. The PL peak at 930 nm is not as large, as in the unpatterned top layer case. The weaker peak at 930 nm can be explained by the fact that the Purcell enhancement at 930 nm is not as strong as in the unpatterned structure.

We have theoretically analyzed, fabricated and measured the metal clad microcavity with a sub-λ/2 semiconductor membrane and a patterned top metal layer. The emitting region is a single quantum well positioned in the middle of membrane 12. At the same external pump power, we measure photoluminescence enhancements of up to 46 times with respect to the unprocessed wafer. We estimate that this enhancement is due to at least a 12-fold increase in the efficiency (relative to an unprocessed wafer), and an increase in the effective pumping intensity resulting from the pump photons trapping within the microcavity. Interesting modifications in the photoluminescence spectra were also experimentally observed, resulting from the simultaneous change in the spontaneous emission rate and the extraction efficiency.

Therefore, the coupling to surface plasmons in the patterned metal clad microcavity can be used to improve the light extraction and enhance the spontaneous emission rate in light emitting devices. One of advantages of this design is the small surface recombination rate, since the semiconductor is not perforated. Furthermore, metallic layers that are already included in the design can also be used as contacts for electrical pumping of the device. Certainly, in order to make good contacts, more attention has to be paid to the proper choice of metal. Devices presently operate in the 980 nm wavelength range, where metal absorption losses are significant. This reduces quality factors of fully processed structures to values between 10 and 15 and broadens their emission. This problem can be overcome by designing devices that operate at longer wavelengths. For example, a surface plasmon laser operating at 17 $\mu$m has been demonstrated recently. We conclude that metal clad microcavities can be used as building blocks for highly efficient light emitting diodes.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An improvement in a light emitting diode comprising:
   an active light emitting semiconductor layer having a first and second parallel surface;
   an optically reflecting layer disposed on said first surface of said semiconductor layer; and
   an optically reflecting grating disposed on said second surface of said active light emitting semiconductor layer, said grating having a pattern which is selected so that surface plasmon waves are coupled through said grating.

2. The improvement of claim 1 wherein said grating has a regular periodic structure.

3. The improvement of claim 2 where said grating has a one dimensionally periodic structure.

4. The improvement of claim 2 where said grating has a two dimensionally periodic structure.

5. The improvement of claim 1 where said optically reflecting grating is partially transparent.

6. The improvement of claim 1 where optically reflecting layer disposed on said first surface is a conductive layer.

7. The improvement of claim 1 where optically reflecting grating disposed on said second surface is a conductive layer.

8. The improvement of claim 1 where said active light emitting semiconductor layer comprises a semiconductor membrane.

9. The improvement of claim 1 where said active light emitting semiconductor layer comprises a layer including a quantum well.

10. The improvement of claim 1 where said grating has a selected pattern which is characterized by its coupling to surface plasmons generated by said light emitting semiconductor layer.

11. The improvement of claim 1 where said light emitting semiconductor layer in combination with said an optically reflecting layer and said an optically reflecting grating comprise a microcavity, said grating characterized by a pattern which couples with surface plasmons in said microcavity.

12. An improved light emitting diode comprising:
    an active light emitting semiconductor layer having a first and second parallel and opposing surface;
    an conductive layer disposed on said first surface of said semiconductor layer; and
    an conductive grating disposed on said second surface of said active light emitting semiconductor layer, said conductive layer and conductive grating with said semiconductor layer therebetween defining a cavity, said grating having a pattern which is selected so that surface plasmon waves within said cavity are coupled through said grating.

13. The light emitting diode of claim 12 wherein said grating has a regular periodic structure.

14. The light emitting diode of claim 13 where said grating has a one dimensionally periodic structure.

15. The light emitting diode of claim 13 where said grating has a two dimensionally periodic structure.

16. The light emitting diode of claim 12 where said grating is partially transparent.

17. A method of improving emission from a light emitting diode comprising:

providing an active light emitting semiconductor layer having a first and second parallel surface;

providing an optically reflecting layer disposed on said first surface of said semiconductor layer;

providing an optically reflecting grating with a selected pattern defined therein, said grating being disposed on said second surface of said active light emitting semiconductor layer; and coupling surface plasmon waves through said optically reflecting grating, said selected pattern characterized by said surface plasmon waves being coupled therethrough.

18. The method of claim 17 where providing an optically reflecting grating with a selected pattern defined therein provides said grating with a periodic pattern.

19. The method of claim 18 where providing a periodic pattern defined in said grating provides a one dimensional periodic pattern.

20. The method of claim 18 where providing a periodic pattern defined in said grating provides a two dimensional periodic pattern.

* * * * *